(12) United States Patent
Xie et al.

(10) Patent No.: US 12,557,464 B2
(45) Date of Patent: Feb. 17, 2026

(54) PEROVSKITE LAYER, MANUFACTURE METHOD FOR PEROVSKITE LAYER, PEROVSKITE LAYER SOLAR CELL, AND PEROVSKITE LAYER SOLAR CELL ASSEMBLY

(71) Applicant: LONGI GREEN ENERGY TECHNOLOGY CO., LTD., Shaanxi (CN)

(72) Inventors: Junjie Xie, Shaanxi (CN); Chen Xu, Shaanxi (CN); Zifeng Li, Shaanxi (CN); Zhao Wu, Shaanxi (CN); Jinling Jin, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 433 days.

(21) Appl. No.: 18/029,058

(22) PCT Filed: Oct. 13, 2021

(86) PCT No.: PCT/CN2021/123523
§ 371 (c)(1),
(2) Date: Mar. 28, 2023

(87) PCT Pub. No.: WO2022/111096
PCT Pub. Date: Jun. 2, 2022

(65) Prior Publication Data
US 2023/0380197 A1    Nov. 23, 2023

(30) Foreign Application Priority Data
Nov. 25, 2020  (CN) .......................... 202011343679.6

(51) Int. Cl.
*H10K 85/50* (2023.01)
*H10K 30/40* (2023.01)
(Continued)

(52) U.S. Cl.
CPC ............. *H10K 30/40* (2023.02); *H10K 71/12* (2023.02); *H10K 71/15* (2023.02); *H10K 71/40* (2023.02);
(Continued)

(58) Field of Classification Search
CPC ........ H10K 30/40; H10K 71/12; H10K 71/40; H10K 30/50; H10K 85/50; H10K 71/15; C30B 7/08; C30B 33/02; Y02E 10/549
See application file for complete search history.

(56) References Cited

U.S. PATENT DOCUMENTS

| | | | |
|---|---|---|---|
| 10,192,689 B2 * | 1/2019 | Etgar | H10K 71/191 |
| 2017/0287648 A1 * | 10/2017 | Wu | H01G 9/2009 |

(Continued)

FOREIGN PATENT DOCUMENTS

| | | |
|---|---|---|
| CN | 105926040 A | 9/2016 |
| CN | 109595132 A | 4/2019 |

(Continued)

OTHER PUBLICATIONS

JP2023549305 first office action.
(Continued)

*Primary Examiner* — David Vu
*Assistant Examiner* — Brandon C Fox
(74) *Attorney, Agent, or Firm* — IPro, PLLC (57) ABSTRACT

The present application discloses a perovskite layer, a method for preparing a perovskite layer, a perovskite-layer solar cell and a perovskite-layer-solar-cell assembly, which relates to the technical field of photovoltaics, and is used to prepare a perovskite layer that can completely cover the substrate and has few defects. The method for preparing a perovskite layer includes: providing a substrate; forming perovskite seed crystals on the substrate; soaking the perovskite seed crystals into a perovskite solution; by the effect
(Continued)

of the perovskite seed crystals, the perovskite seed crystals growing into a perovskite thin film; and performing annealing treatment to the perovskite thin film, to form the perovskite layer. The perovskite layer and the preparing method thereof according to the present application are used for the fabrication of a solar cell.

17 Claims, 5 Drawing Sheets (51) Int. Cl.
*H10K 71/12* (2023.01)
*H10K 71/15* (2023.01)
*H10K 71/40* (2023.01)
*H10K 77/10* (2023.01)
*C30B 7/08* (2006.01)
*C30B 33/02* (2006.01)
*H10K 30/50* (2023.01)

(52) U.S. Cl.
CPC ............ *H10K 77/10* (2023.02); *H10K 85/50* (2023.02); *C30B 7/08* (2013.01); *C30B 33/02* (2013.01); *H10K 30/50* (2023.02); *Y02E 10/549* (2013.01)

(56) References Cited

U.S. PATENT DOCUMENTS

| 2019/0173025 A1* | 6/2019 | Uchida | H10F 77/127 |
| 2020/0335285 A1* | 10/2020 | Surya | H10K 71/40 |
| 2021/0062364 A1* | 3/2021 | Joglekar | C30B 7/14 |

FOREIGN PATENT DOCUMENTS

| CN | 110854274 A | 2/2020 |
| CN | 111384243 A | 7/2020 |
| CN | 112467043 A | 3/2021 |
| EP | 3979350 A1 | 4/2022 |
| WO | 2018123402 A1 | 7/2018 |

OTHER PUBLICATIONS

Gu, Zhenkun, et al. "A general printing approach for scalable growth of perovskite single-crystal films." Science advances 4.6 (2018): eaat2390.

Damg, Yangyang. "Study on the growth and properties of New Hybrid Halide perovskite single crystal materials." A dissertation for doctoral degree. Shandong University. Mar. 20, 2017.

EP21896598.6 extended European search report dated May 6, 2025.

* cited by examiner

PEROVSKITE LAYER, MANUFACTURE METHOD FOR PEROVSKITE LAYER, PEROVSKITE LAYER SOLAR CELL, AND PEROVSKITE LAYER SOLAR CELL ASSEMBLY

CROSS-REFERENCES TO RELATED APPLICATIONS

The present application claims the priority of the Chinese patent application filed on Nov. 25, 2020 before the Chinese Patent Office with the application number of 202011343679.6 and the title of "PEROVSKITE LAYER, MANUFACTURE METHOD FOR PEROVSKITE LAYER, PEROVSKITE LAYER SOLAR CELL, AND PEROVSKITE LAYER SOLAR CELL ASSEMBLY", which is incorporated herein in its entirety by reference.

TECHNICAL FIELD

The present application relates to the technical field of photovoltaics and, more particularly, to a perovskite layer, a method for preparing a perovskite layer, a perovskite-layer solar cell and a perovskite-layer-solar-cell assembly.

BACKGROUND

When perovskite solar cells are prepared, the perovskite layer is usually prepared by using wet-chemistry methods. In the preparation of the perovskite layer, usually a perovskite-precursor solution is coated on the substrate, and subsequently the solute is crystallized and precipitated by oven drying and so on, to form the perovskite layer.

In the prior art, the formed perovskite layer frequently cannot completely cover the substrate, and has many defects such as cracks, big grain boundaries and voids, which seriously affects the performance of the perovskite cells. In the prior art, although the defects such as cracks, big grain boundaries and voids in the crystallization process of the perovskite thin film can be alleviated by an anti-solvent method and a two-steps deposition method, in the process of crystallization and crystal grain growth, the defects caused by that the perovskite solute has a low diffusion speed and cannot be timely supplemented to the periphery of the perovskite seed crystals still exist. Furthermore, when the perovskite layer is prepared by using the anti-solvent method, the two-step method and so on, the process is difficult to control, and has high requirements on the factors such as the environment and the atmosphere, and all of the anti-solvents currently used have a high toxicity.

SUMMARY

An objective of the present application is to provide a perovskite layer, a method for preparing a perovskite layer, a perovskite-layer solar cell and a perovskite-layer-solar-cell assembly, to prepare a perovskite layer that can completely cover the substrate and has few defects.

In the first aspect, the present application provides a method for preparing a perovskite layer. The method for preparing a perovskite layer includes: providing a substrate; forming perovskite seed crystals on the substrate; soaking the perovskite seed crystals into a perovskite solution to grow into a perovskite thin film; and performing annealing treatment to the perovskite thin film, to form the perovskite layer.

In some possible implementations, during the growing of the perovskite seed crystals into the perovskite thin film, a solubility of a perovskite material in the perovskite solution is reduced to facilitate the perovskite material to precipitate from the perovskite solution and supply the perovskite material for the growing of the perovskite seed crystals. With the decreasing of the solubility of the perovskite material in the perovskite solution, the perovskite solute in the perovskite solution more approaches or is in the saturation state, which enables the perovskite solute to easily precipitate from the perovskite solution. At this point, the perovskite solute can be quickly delivered to the periphery of the perovskite seed crystals by diffusion, to timely supplement the perovskite solute around the perovskite seed crystals that is consumed by the crystal precipitation. Based on that, in an aspect, because of the timely supplementation of the perovskite solute, the generation of the defects such as grain boundaries and voids during the growing of the perovskite thin film can be reduced, and the compactness of the perovskite thin film can be increased. In another aspect, because the perovskite solute can be quickly delivered to the periphery of the perovskite seed crystals, that can facilitate the perovskite seed crystals to grow up, and increase the growth speed of the perovskite thin film, thereby increasing the production efficiency, and saving the production time.

In some possible implementations, the solubility of the perovskite material is reduced by cooling. In an aspect, such a cooling mode is easy to implement, which can reduce the difficulty in the process. In another aspect, the process of reducing the solubility of the perovskite material can be conveniently regulated by regulating the temperature, whereby the process of reducing the solubility of the perovskite material has a high controllability.

In some possible implementations, a cooling speed of the cooling is 0.1° C./h-10° C./h. In this case, the speed of the decreasing of the solubility of the perovskite material is proper, which can ensure the quality of the perovskite thin film while increasing the growth speed of the perovskite thin film. That cannot only prevent the problem of excessively many defects caused by an excessively high growth speed of the perovskite crystal, but also can prevent the problem of a low production efficiency caused by an excessively low growth speed of the perovskite crystal.

In some possible implementations, before the cooling, an initial temperature of the perovskite solution is 100° C.-150° C. In this case, the perovskite solution has a higher initial temperature, which facilitates the cooling operation, and has a low cost of the cooling.

In some possible implementations, during the growing of the perovskite seed crystals into the perovskite thin film, volatilization of a solvent is accelerated to facilitate the perovskite material to precipitate from the perovskite solution and supply the perovskite material for the growing of the perovskite seed crystals. By accelerating the solvent volatilization, the perovskite material in the perovskite solution can more approach or be in the saturation state, which reduces the generation of the defects such as grain boundaries and voids during the growing of the perovskite seed crystals into the perovskite thin film, to increase the compactness and the growth speed of the perovskite thin film.

In some possible implementations, the volatilization of the solvent is accelerated by heating. In this case, the speed of the solvent volatilization can be conveniently regulated by controlling the heating temperature, thereby regulating the growth speed of the perovskite thin film.

In some possible implementations, an initial temperature of the perovskite solution is 20° C.-30° C.; and during the growing of the perovskite seed crystals into the perovskite thin film, the heating temperature is 40° C.-100° C. In this case, the perovskite solution has a lower initial temperature, which facilitates the preparation of the perovskite solution and, when it is heated to a high temperature, has a low cost. Furthermore, the temperature difference between the heating temperature and the initial temperature is proper, which can ensure the quality of the perovskite thin film while increasing the growth speed of the perovskite thin film.

In some possible implementations, when the perovskite seed crystals are soaked into the perovskite solution, the perovskite solution is a saturated solution. The perovskite solution in the saturation state can enable the perovskite material to more easily precipitate from the perovskite solution, and, by the effect of the perovskite seed crystals, quickly precipitate at the surface of the perovskite seed crystals, to facilitate the perovskite seed crystals to grow, to form the perovskite thin film of few defects and a high density.

In some possible implementations, the perovskite seed crystals are distributed on the substrate in a discrete distribution. In this case, the plurality of perovskite seed crystals discretely distributed on the substrate, as the plurality of growing base points for the growth of the perovskite thin film, can continuously grow to form the continuous perovskite thin film. In that process, the perovskite seed crystals discretely distributed can prevent the problem of excessively small crystal grains of the perovskite thin film caused by mutual overlapping and covering among the perovskite seed crystals, whereby a uniform perovskite thin film can be formed, and fully covers the whole substrate.

In some possible implementations, a coverage rate of the perovskite seed crystals on the substrate is 10%-50%, and a particle size of the perovskite seed crystals is 10 nm-200 nm. In an aspect, the perovskite seed crystals with the particle size of 10 nm-200 nm have a moderate size, which can prevent the problem of many internal defects when the perovskite seed crystals have an excessively high grain size. In another aspect, on the premise of the perovskite seed crystals having the above-described particle size, when the coverage rate is 10%-50%, the spacing between and the quantity of the perovskite seed crystals distributed on the substrate are proper. By the effect of those perovskite seed crystals, the perovskite thin film that has a high grain size and few defects such as grain boundaries can be quickly formed. That cannot only prevent the problems of a low grain size and many grain boundaries of the perovskite thin film caused by an excessively low spacing between the perovskite seed crystals (an excessively high coverage rate), but also can prevent the problem of a low growth speed of the perovskite thin film caused by an excessively high spacing between the perovskite seed crystals (an excessively low coverage rate).

In some possible implementations, the step of forming the perovskite seed crystals on the substrate includes:
  coating a perovskite-precursor solution onto the substrate, and volatilizing a solvent of the perovskite-precursor solution, to form perovskite-seed-crystal intermediates; and
  performing annealing treatment to the perovskite-seed-crystal intermediates, to form the perovskite seed crystals.

In some possible implementations, a concentration of the perovskite-precursor solution is less than or equal to 0.1 mol/L. In this case, the solvent of the higher amount in the perovskite-precursor solution can separate the perovskite seed crystals that are crystallized and precipitated, to form the perovskite seed crystals discretely distributed, so as to form the perovskite seed crystals that have the above coverage rate and are discretely distributed. The dispersion degree and the coverage rate of the perovskite seed crystals may be regulated by regulating the concentration of the perovskite-precursor solution.

In some possible implementations, a duration of the annealing treatment for forming the perovskite seed crystals is 1 min-30 min. When the annealing duration is within that range, the perovskite seed crystals formed after the annealing have a moderate grain size. In addition, the annealing duration within that range can prevent the problem of overgrowth of the perovskite seed crystals caused by an excessively long annealing duration, thereby reducing the defects inside the perovskite seed crystals.

In some possible implementations, a general formula of the perovskite seed crystals is ABX3; the perovskite-precursor solution includes an AX precursor and a BX2 precursor, wherein X is a halogen element, and A and B are cations; and the perovskite seed crystals are an organic-inorganic hybrid material, and a ratio of an amount of substance of the AX precursor to an amount of substance of the BX2 precursor is (2-15):1. By using the above precursor ratio, the perovskite seed crystals that are discretely distributed and have the above coverage rate can be formed after the annealing. Based on that, the coverage rate of the perovskite seed crystals may be regulated by regulating the ratio of the amount of substance of the AX precursor to the amount of substance of the BX2 precursor. The perovskite seed crystals may also be a fully inorganic material, and a ratio of an amount of substance of the AX precursor to an amount of substance of the BX2 precursor is (0.95-1.05):1. In this case, the coverage rate of the perovskite seed crystals may be regulated by regulating the concentrations of the precursors.

In some possible implementations, the perovskite seed crystals are an organic-inorganic hybrid material, a temperature of the annealing treatment for forming the perovskite seed crystals is 60° C.-130° C. In the process of performing the annealing treatment to the perovskite-seed-crystal intermediates to form the perovskite seed crystals, the high temperature of the annealing treatment can volatilize the organic halide at the same time. It can be seen that, when AX is an organic halide, the excessive AX precursor remaining after the formation of the perovskite seed crystals can be conveniently removed.

In some possible implementations, the perovskite seed crystals are a fully inorganic material, and a temperature of the annealing treatment is 120° C.-220° C.

In the second aspect, the present application further provides a perovskite layer, wherein the perovskite layer includes perovskite seed crystals and a perovskite thin film; and a first interface is disposed between the perovskite seed crystals and the perovskite thin film, wherein the first interface is an interface that is observable by using a high-resolution scanning electron microscope. The first interface that can be observed by using a high-resolution scanning electron microscope is formed between the perovskite seed crystals and the perovskite thin film.

In some possible implementations, the first interface formed between the perovskite seed crystals and the perovskite thin film includes a structure transition layer, wherein a lattice parameter of the structure transition layer changes in a first order, and an atom-arrangement mode of the structure transition layer changes in a second order, wherein the first order refers to an order in which, in a direction further away from the perovskite seed crystals, an initial parameter changes into a second parameter greater than the initial parameter and subsequently changes into the initial parameter, and the second order refers to an order in which, in the direction further away from the perovskite seed crystals, an ordered arrangement changes into an unordered arrangement and subsequently changes into an ordered arrangement. Because the lattice parameter of the structure transition layer changes in the first order, and the atom-arrangement mode of the structure transition layer changes in the second order, the defect concentration also changes in the order in which, in the direction further away from the perovskite seed crystals, an initial concentration changes into a second concentration greater than the initial concentration and subsequently changes into the initial concentration, and therefore the variation of the perovskite seed crystals is slower in the process of the formation of the perovskite thin film, whereby the formed first interface has fewer defects, to prevent sudden change of the perovskite thin film due to a direct changing.

In some possible implementations, a thickness of the structure transition layer is greater than or equal to 0.5 nm, and less than or equal to 5 nm. Accordingly, the perovskite seed crystals and the perovskite thin film have the effect of "slow transition".

In the third aspect, the present application provides a perovskite solar cell, wherein the perovskite solar cell includes the perovskite layer according to the second aspect or any one of the possible implementations of the second aspect.

The advantageous effects of the perovskite layer according to the second aspect may refer to the advantageous effects of the perovskite layer according to the second aspect or any one of the possible implementations of the second aspect, and are not discussed herein further.

In the fourth aspect, the present application provides a perovskite-layer-solar-cell assembly, wherein the perovskite-layer-solar-cell assembly includes the perovskite solar cell according to the third aspect.

The advantageous effects of the perovskite-layer-solar-cell assembly according to the third aspect may refer to the advantageous effects of the perovskite layer according to the second aspect or any one of the possible implementations of the second aspect, and are not discussed herein further.

BRIEF DESCRIPTION OF THE DRAWINGS

The drawings illustrated herein are intended to provide a further understanding of the present application, and form part of the present application. The illustrative embodiments of the present application and their explanation are intended to interpret the present application, and do not inappropriately limit the present application. In the drawings.

DETAILED DESCRIPTION

In order to facilitate the clear description on the technical solutions of the embodiments of the present application, in the embodiments of the present application, terms such as "first" and "second" are used to distinguish identical items or similar items that have substantially the same functions and effects. A person skilled in the art can understand that the terms such as "first" and "second" do not limit the quantity and the execution order, and the terms such as "first" and "second" do not necessarily limit different features.

After tens of years of the development of perovskite solar cells, their photoelectric conversion efficiency has approached the level of crystalline-silicon solar cells. Because perovskite solar cells have many advantages such as a high conversion efficiency, a simple device structure and a fabricating process mainly employing wet-chemistry methods, they have become the next-generation solar cell that is most likely to be practically applied.

Figure 1:
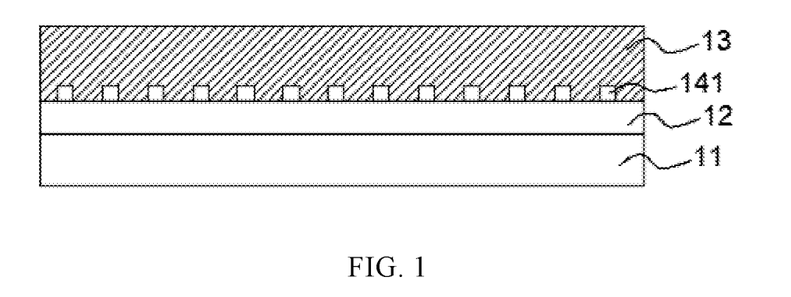
FIGS. 1-3 are schematic diagrams of the process for fabricating a perovskite layer in the prior art.
Figure 2:
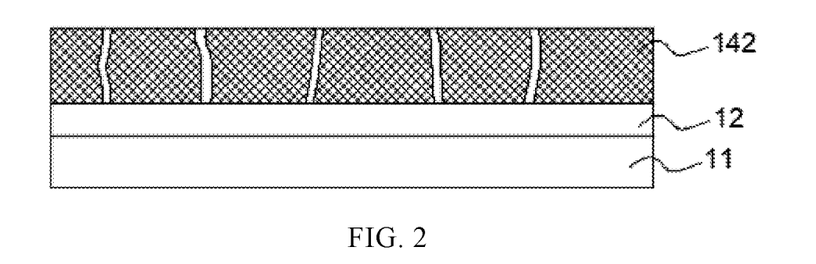

Currently the perovskite layer of the perovskite cells is prepared mainly by using wet-chemistry methods. The main process of preparing the perovskite layer includes the following steps. As shown in FIG. 1, no matter whether a one-step method or a two-step method is used, a perovskite-precursor solution is coated in advance on a substrate 11 having an electron transporting layer 12 to form a perovskite-precursor-solution layer 13. As shown in FIG. 2, subsequently, by directly oven drying, anti-solvent crystallization, vacuum flash distillation and so on, the solvent in the perovskite-precursor-solution layer 13 is volatilized, and the solute (the perovskite material) is crystallized and precipitated, to form a perovskite thin film. The perovskite thin film, after annealing treatment, can form a perovskite layer 142.

In the above process of preparing the perovskite layer, as shown in FIG. 1, after the perovskite-precursor-solution layer 13 has been coated on the substrate 11 having the electron transporting layer 12, with the volatilization of the solvent, some very small perovskite crystal grains are firstly precipitated at the part where the perovskite-precursor-solution layer 13 and the electron transporting layer 12 contact, and those crystal grains serve as the perovskite seed crystals 141 of the perovskite thin film.

Figure 3:
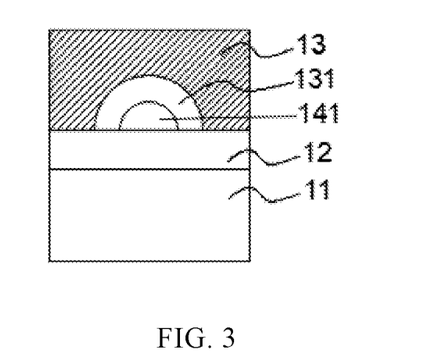

As shown in FIG. 3, after the perovskite seed crystals 141 have been formed, the concentration of the perovskite solute around them decreases, and a layer of low-concentration region 131 is formed. Inside the low-concentration region 131, the concentration of the perovskite solute is less than the concentration of the perovskite solute in the perovskite-precursor-solution layer 13. By the driving by the concentration difference, the perovskite solute in the perovskite-precursor-solution layer 13 is delivered by diffusion to the low-concentration region 131. Simultaneously with such diffusion delivering, the solvent in the perovskite-precursor-solution layer 13 continuously volatilizes. The volatilization of the solvent of the perovskite-precursor-solution layer 13 increases the concentration difference between the perovskite-precursor-solution layer 13 and the low-concentration region 131, whereby accelerating the growth of the perovskite seed crystals 141. With such a mechanism, the solute in the perovskite-precursor-solution layer 13 is continuously delivered to the surface of the perovskite seed crystals 141, the perovskite seed crystals 141 gradually grow, and finally a layer of the perovskite thin film is formed on the electron transporting layer 12.

In the process of crystallization and crystal grain growth, the perovskite solute has a low diffusion speed and cannot be timely supplemented to the periphery of the perovskite seed crystals 141, thus resulting in the defects. An embodiment of the present application provides a perovskite layer. The perovskite layer cannot only completely cover the substrate 21, but also has a high thin-film quality, with few defects. Moreover, the perovskite layer 24 has a short preparation duration, a high growth speed and a high working efficiency. The perovskite layer may be an organic-inorganic hybrid perovskite layer, may also be an inorganic perovskite layer, and may also be an organic perovskite layer. Particularly, the perovskite layer may also be a lead-free perovskite layer or a dual perovskite layer.

An embodiment of the present application further provides a method for preparing the perovskite layer stated above. FIGS. 4-11 show schematic diagrams of the states of the stages of a method for fabricating a perovskite-layer solar cell according to an embodiment of the present application. As shown in FIGS. 4-11, the method for preparing a perovskite layer according to an embodiment of the present application is as follows.

Figure 4:
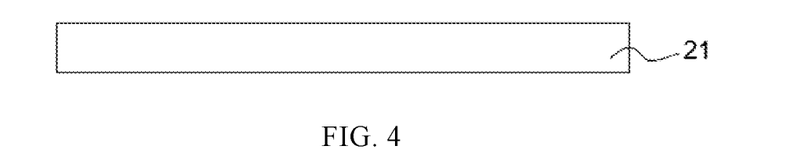
FIGS. 4-11 are schematic diagrams of the states of the stages of a method for preparing a perovskite layer according to some embodiments of the present application.

As shown in FIG. 4, a substrate 21 is provided. The substrate 21 is an electrically conducting substrate. Particularly, the substrate 21 may be any one of a tin-doped indium oxide (ITO) transparent electrically conducting glass, a zinc-doped indium oxide (IZO) transparent electrically conducting glass, a tungsten-doped indium oxide (IWO) transparent electrically conducting glass, a titanium-doped indium oxide (ITIO) transparent electrically conducting glass, a fluorine-doped tin oxide (FTO) transparent electrically conducting glass, and an aluminum-doped zinc oxide (AZO) transparent electrically conducting glass. In practical applications, the substrate 21 may be commercially obtained, and may also be self-prepared by magnetron sputtering and so on.

By using the above technical solution, the process of forming the perovskite seed crystals and growing the perovskite seed crystals into the perovskite thin film is performed in two steps. Firstly, the perovskite seed crystals are formed on the substrate, and subsequently the perovskite seed crystals are soaked into the perovskite solution to grow into the perovskite thin film. Based on that, the process of forming the perovskite seed crystals can be independently regulated, whereby the perovskite seed crystals that have a high grain size and are distributed throughout the substrate can be formed. By the effect of the perovskite seed crystals that have a high grain size and are distributed throughout the substrate, the perovskite thin film covering the whole substrate can grow, and the defects of the perovskite thin film can be reduced. In this case, such a perovskite thin film, after the annealing treatment, can form the perovskite layer that covers the whole substrate and has few defects, thereby increasing the conversion efficiency of the perovskite layer, and reducing the risk of electric leakage.

In order to facilitate to process the substrate 21 in the subsequently operations, the substrate 21 may also be washed.

Figure 5:
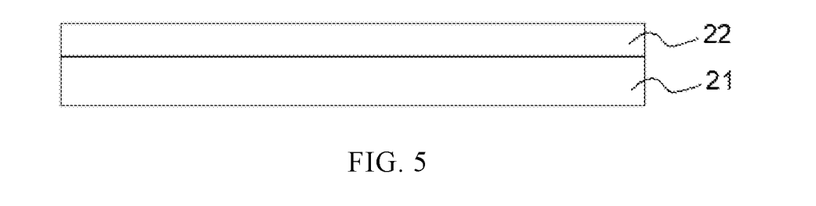

As shown in FIG. 5, an electron transporting layer 22 is formed on the substrate 21. The material of the electron transporting layer 22 may be any one of $SnO_2$, $TiO_2$ and isomethyl [6,6]-phenyl-C61-butyrate (PCBM), but is not limited thereto. The thickness of the electron transporting layer 22 may be 50 nm-100 nm. The process for fabricating the electron transporting layer 22 may be spin coating, vapor deposition and so on, but is not limited thereto.

Figure 6:
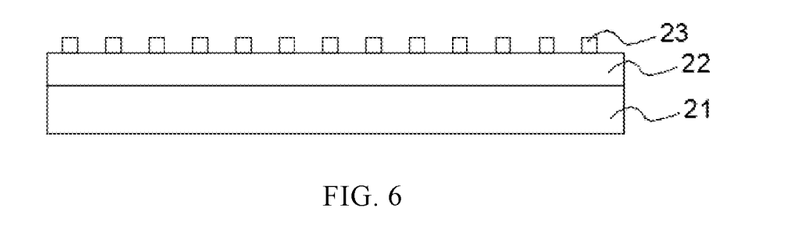

As shown in FIG. 6, perovskite seed crystals 23 are formed on the substrate 21 having the electron transporting layer 22. The formation of the perovskite seed crystals 23 mainly includes the following steps:

coating a perovskite-precursor solution onto the substrate 21, and volatilizing a solvent of the perovskite-precursor solution, to form perovskite-seed-crystal intermediates 231; and performing annealing treatment to the perovskite-seed-crystal intermediates 231, to form the perovskite seed crystals 23.

The perovskite seed crystals 23 are distributed on the substrate 21 in a discrete distribution. A plurality of particles of the perovskite seed crystals 23 are distributed on the whole substrate 21, and the perovskite seed crystals 23 have a certain gap therebetween, and have no overlapping or covering. In this case, the plurality of perovskite seed crystals 23 discretely distributed on the substrate 21, as the plurality of growing base points for the growth of the perovskite thin film, can continuously grow to form the continuous perovskite thin film. In that process, the perovskite seed crystals 23 discretely distributed can prevent the problem of excessively small crystal grains of the perovskite thin film caused by mutual overlapping and covering among the perovskite seed crystals 23, whereby a uniform perovskite thin film can be formed, and fully covers the whole substrate 21.

The coverage rate of the perovskite seed crystals 23 on the substrate 21 may be 10%-50%, and the particle size of the perovskite seed crystals 23 may be 10 nm-200 nm. In an aspect, the perovskite seed crystals 23 of the particle size of 10 nm-200 nm have a moderate size, which cannot only prevent the problem of many internal defects when the perovskite seed crystals 23 have an excessively high grain size, but also can prevent the problem that, when the perovskite seed crystals 23 have an excessively low grain size, the subsequent growth of the perovskite thin film has a low speed. In another aspect, on the premise of the perovskite seed crystals 23 having the above-described particle size, when the coverage rate is 10%-50%, the spacing between and the quantity of the perovskite seed crystals 23 distributed on the substrate 21 are proper. By the effect of those perovskite seed crystals 23, the perovskite thin film that has a high grain size and few defects such as grain boundaries can be quickly formed. That cannot only prevent the problems of a low grain size and many grain boundaries of the perovskite thin film caused by an excessively low spacing between the perovskite seed crystals 23 (an excessively high coverage rate), but also can prevent the problem of a low growth speed of the perovskite thin film caused by an excessively high spacing between the perovskite seed crystals 23 (an excessively low coverage rate).

As an example, the coverage rate of the perovskite seed crystals 23 on the substrate 21 may be 10%, 18%, 20%, 25%, 30%, 34%, 40%, 45%, 50% and so on. The particle size of the perovskite seed crystals 23 may be 10 nm, 20 nm, 50 nm, 70 nm, 90 nm, 100 nm, 120 nm, 150 nm, 175 nm, 185 nm, 190 nm, 200 nm and so on.

In practical applications, the above-described perovskite seed crystals 23 may be obtained by regulating the concentration of the perovskite-precursor solution. Particularly, the concentration of the perovskite-precursor solution may be less than or equal to 0.1 mol/L. The concentrations of commonly used perovskite-precursor solutions for preparing perovskite layers are 0.5 mol/L-1.5 mol/L, while in the embodiments of the present application, the concentration of the perovskite-precursor solution is far less than the commonly used concentrations. The solvent of the higher amount can separate the perovskite seed crystals 23 that are crystallized and precipitated, to form the perovskite seed crystals 23 discretely distributed, so as to form the perovskite seed crystals 23 that have the above coverage rate and are discretely distributed. In this case, the dispersion degree and the coverage rate of the perovskite seed crystals 23 may be regulated by regulating the concentration of the perovskite-precursor solution. If the concentration of the perovskite-precursor solution is lower, the coverage rate of the perovskite seed crystals 23 is lower, and the dispersity of the perovskite seed crystals 23 is higher.

As an example, the concentration of the perovskite-precursor solution may be 0.1 mol/L, 0.09 mol/L, 0.08 mol/L, 0.07 mol/L, 0.06 mol/L, 0.05 mol/L, 0.04 mol/L, 0.03 mol/L, 0.02 mol/L, 0.01 mol/L and so on. In order to obtain the perovskite seed crystals 23 of a good coverage rate, the concentration of the perovskite-precursor solution may be 0.02 mol/L-0.05 mol/L.

Figure 15:
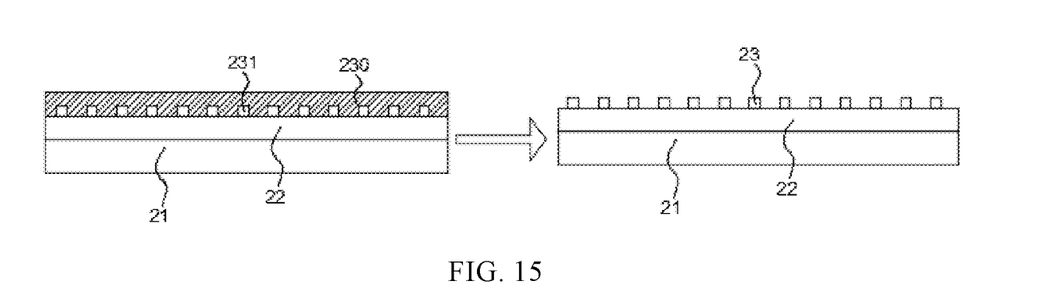
FIG. 15 is a schematic diagram of the formation of the perovskite seed crystals by annealing treatment when AX is an organic halide and is excessive according to an embodiment of the present application.

In practical applications, the above-described perovskite seed crystals 23 may also be obtained by regulating the ratio of the perovskite-precursor solution. The general formula of the perovskite material is $ABX_3$, the perovskite-precursor solution includes an AX precursor and a $BX_2$ precursor, wherein X is a halogen element, and A and B are cations. The perovskite material may be an organic-inorganic hybrid material, and the ratio of the amount of substance of the AX precursor to the amount of substance of the $BX_2$ precursor may be (2-15):1. In the perovskite-precursor solution used for preparing the perovskite layer, the ratio of the amount of substance of the AX precursor to the amount of substance of the $BX_2$ precursor is generally 1:1. Even if, taking passivation of the defects into consideration, one of the precursors is caused to be excessive, the ratio of AX:$BX_2$ is between (0.9-1.1):1. In an embodiment of the present application, as shown in FIG. 15, the amount of substance of the AX precursor is higher, and after the solvent of the perovskite-precursor solution has been volatilized to form the perovskite-seed-crystal intermediates 231, more AX precursor remains. Those excessive AX precursors can separate the plurality of perovskite-seed-crystal intermediates 231, whereby the perovskite seed crystals 23 that are discretely distributed and have the above coverage rate can be formed after the annealing. Based on that, the coverage rate of the perovskite seed crystals 23 may be regulated by regulating the ratio of the amount of substance of the AX precursor to the amount of substance of the $BX_2$ precursor. If the amount of substance of the AX precursor is higher than the amount of substance of $BX_2$ to a larger extent, the coverage rate of the perovskite seed crystals 23 is lower, and the dispersity of the perovskite seed crystals 23 is higher. When the perovskite material is a fully inorganic material, the ratio of the amount of substance of the AX precursor to the amount of substance of the $BX_2$ precursor may be (0.95-1.05):1. In this case, the coverage rate of the perovskite seed crystals may be regulated by regulating the concentrations of the precursors.

As an example, the ratio of the amount of substance of the AX precursor to the amount of substance of the $BX_2$ precursor may be 2:1, 3:1, 5:1, 7:1, 9:1, 10:1, 11:1, 12.5:1, 13:1, 13.4:1, 15:1 and so on. In order to obtain the perovskite seed crystals 23 with a proper coverage rate, the ratio of the amount of substance of the AX precursor to the amount of substance of the $BX_2$ precursor may be (5-10):1.

The method for coating the perovskite-precursor solution may be any one of blade coating, spin coating, drip coating, ink jetting, rotary gravure plate coating, spray coating and roller coating. The method for volatilizing the solvent of the perovskite-precursor solution may be natural volatilization, oven-dried volatilization, vacuum flash distillation and anti-solvent accelerated crystallization, but is not limited thereto, as long as it can be ensured that the solvent of the perovskite-precursor solution can be volatilized off.

The duration of the annealing treatment may be 1 min-30 min. For example, the annealing duration may be 1 min, 10 min, 12 min, 17 min, 20 min, 25 min, 28 min, 30 min and so on. In this case, the perovskite seed crystals 23 formed after the annealing have a moderate grain size. In addition, the annealing duration within that range can prevent the problem of overgrowth of the perovskite seed crystals 23 caused by an excessively long annealing duration, thereby reducing the defects inside the perovskite seed crystals 23.

The temperature of the annealing treatment may be set according to the perovskite seed crystals. Because the perovskite seed crystals 23 are dispersive discontinuous small crystal grains, the annealing temperature for forming the perovskite seed crystals 23 should be less than the annealing temperature for forming the perovskite thin film by 20° C.-50° C. When the perovskite seed crystals are a fully inorganic material, the temperature of the annealing treatment may be 120° C.-220° C. That can ensure that the perovskite seed crystals 23 formed after the annealing treatment have few defects, and can prevent stoichiometric mismatching and decomposition of the perovskite seed crystals 23. Preferably, the temperature of the annealing treatment may be 160° C.-200° C. For example, when the perovskite seed crystals are a fully inorganic material, the temperature of the annealing treatment may be 120° C., 130° C., 150° C., 160° C., 170° C., 180° C., 190° C., 200° C., 210° C., 220° C. and so on.

When the perovskite seed crystals are an organic-inorganic hybrid perovskite material, or, in other words, when AX is an organic halide, the temperature of the annealing treatment may be 60° C.-130° C. Preferably, the temperature of the annealing treatment may be 90° C.-110° C. For example, when the perovskite seed crystals are an organic-inorganic material, the temperature of the annealing treatment may be 60° C., 70° C., 80° C., 90° C., 95° C., 100° C., 108° C., 110° C., 120° C., 130° C. and so on.

Figure 7:
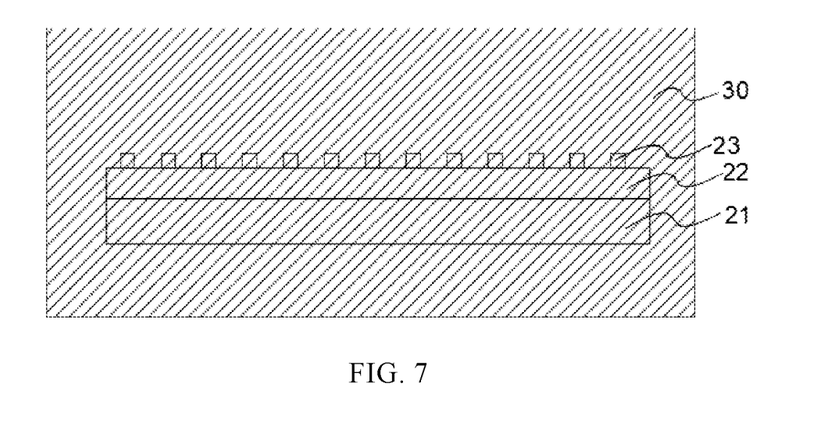
Figure 8:
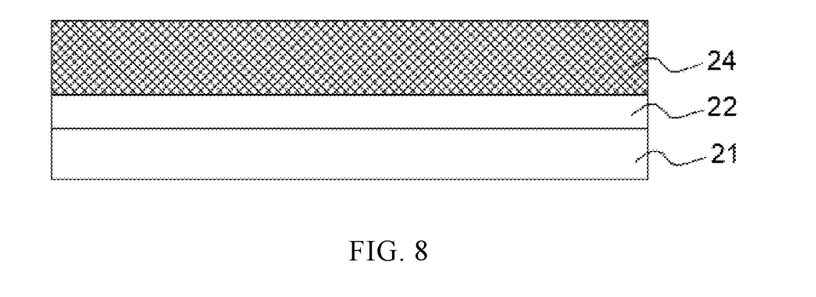

As shown in FIG. 7, the perovskite seed crystals 23 are soaked into a perovskite solution 30. The perovskite solution 30 may be prepared by dissolving the perovskite material, and may also be the perovskite-precursor solution. As shown in FIG. 8, by the effect of the perovskite seed crystals 23, the perovskite seed crystals 23 grow into the perovskite thin film. The perovskite thin film undergoes the annealing treatment, to form the perovskite layer 24.

In order to reduce the defects of the perovskite thin film such as cracks, grain boundaries and voids, during the growing of the perovskite seed crystals 23 into the perovskite thin film, the solubility of the perovskite material may be reduced. With the decreasing of the solubility of the perovskite material in the perovskite solution 30, the perovskite solute in the perovskite solution 30 more approaches or is in the saturation state, which enables the perovskite solute to easily precipitate from the perovskite solution 30. At this point, the perovskite solute can be quickly delivered to the periphery of the perovskite seed crystals 23 by diffusion, to timely supplement the perovskite solute around the perovskite seed crystals 23 that is consumed by the crystal precipitation. Based on that, in an aspect, because of the timely supplementation of the perovskite solute, the generation of the defects such as grain boundaries and voids in the growth of the perovskite thin film can be reduced, and the compactness of the perovskite thin film can be increased. In another aspect, because the perovskite solute can be quickly delivered to the periphery of the perovskite seed crystals 23, that can facilitate the quick growth of the perovskite seed crystals 23, and increase the growth speed of the perovskite thin film, thereby increasing the production efficiency, and saving the production time.

There may be various modes of reducing the solubility of the perovskite material. For example, that may be performed by reducing the intensity of pressure. As another example, that may be performed by reducing the temperature. When the solubility of the perovskite material is reduced by cooling, in an aspect, such a cooling mode is easy to implement, which can reduce the difficulty in the process. In another aspect, the process of reducing the solubility of the perovskite material can be conveniently regulated by regulating the temperature, whereby the process of reducing the solubility of the perovskite material has a high controllability.

The cooling speed of the cooling is positively correlated with the speed of the decreasing of the solubility of the perovskite material in the perovskite solution 30, and the speed of the decreasing of the solubility of the perovskite material is positively correlated with the growth speed of the perovskite thin film. Based on that, the cooling speed of the cooling may be $0.1°$ C./h-$10°$ C./h. In this case, the speed of the decreasing of the solubility of the perovskite material is proper, which can ensure the quality of the perovskite thin film while increasing the growth speed of the perovskite thin film. That cannot only prevent the problem of excessively many defects caused by an excessively high growth speed of the perovskite crystal, but also can prevent the problem of a low production efficiency caused by an excessively low growth speed of the perovskite crystal.

As an example, the cooling speed of the cooling may be $0.1°$ C./h, $0.5°$ C./h, $1°$ C./h, $3°$ C./h, $4.5°$ C./h, $5°$ C./h, $6.2°$ C./h, $7°$ C./h, $8.2°$ C./h, $9°$ C./h, $10°$ C./h and so on.

Before the cooling, the initial temperature of the perovskite solution 30 may be $100°$ C.-$150°$ C. For example, the initial temperature of the perovskite solution 30 may be $100°$ C., $110°$ C., $121°$ C., $135°$ C., $146°$ C., $150°$ C., $160°$ C., $180°$ C., $192°$ C., $200°$ C. and so on. In this case, the perovskite solution 30 has a higher initial temperature, which facilitates the cooling operation, and has a low cost of the cooling. Before soaking the substrate 21 having the perovskite seed crystals 23 into the perovskite solution 30, in order to enable the initial temperature of the entire system to be constant, the substrate 21 may also be preheated to the initial temperature. Based on such a mode of growing the perovskite thin film, the preparation of the perovskite solution 30 may include firstly heating the solvent to the initial temperature, and subsequently adding the perovskite solute while stirring. The solvent of the perovskite solution 30 may be one or a mixture of N,N-dimethylformamide (DMF, with a boiling point of $153°$ C.), dimethyl sulfoxide (DMSO, with a boiling point of $189°$ C.), N-methylpyrrolidone (NMP, with a boiling point of $202°$ C.) and γ-butyrolactone (with a boiling point of $204°$ C.). The initial temperature is relatively high, whereby the perovskite solution 30 with a high solubility can be obtained, and is always less than the boiling point of the solvent.

In order to reduce the defects of the perovskite thin film such as cracks, grain boundaries and voids, during the growing of the perovskite seed crystals 23 into the perovskite thin film, the saturation of the perovskite material may be increased by accelerating the solvent volatilization. By accelerating the solvent volatilization, the perovskite solute in the perovskite solution 30 can more approach or be in the saturation state, which reduces the generation of the defects such as grain boundaries and voids in the growth of the perovskite seed crystals 23 into the perovskite thin film, to increase the compactness and the growth speed of the perovskite thin film.

Particularly, the volatilization of the solvent may be accelerated by heating. In this case, the speed of the solvent volatilization can be conveniently regulated by controlling the heating temperature, thereby regulating the growth speed of the perovskite thin film.

The initial temperature of the perovskite solution 30 may be $20°$ C.-$30°$ C. During the growing of the perovskite seed crystals 23 into the perovskite thin film, the heating temperature may be $40°$ C.-$100°$ C. Preferably, the heating temperature may be $50°$ C.-$70°$ C. In this case, the perovskite solution 30 has a lower initial temperature, which facilitates the preparation of the perovskite solution 30 and, when it is heated to a high temperature, has a low cost. Furthermore, the temperature difference between the heating temperature and the initial temperature is proper, which can ensure the quality of the perovskite thin film while increasing the growth speed of the perovskite thin film. As an example, the initial temperature of the perovskite solution 30 may be $20°$ C., $21.5°$ C., $22°$ C., $23°$ C., $24.5°$ C., $25.1°$ C., $26°$ C., $27°$ C., $28°$ C., $29°$ C., $30°$ C. and so on. The heating temperature may be $40°$ C., $50°$ C., $60°$ C., $70°$ C., $80°$ C., $90°$ C., $100°$ C. and so on. Based on that, the perovskite solution 30 may be prepared at room temperature. After the substrate 21 having the perovskite seed crystals 23 has been soaked into the perovskite solution 30, the perovskite solution 30 may be heated, to accelerate the solvent volatilization.

The perovskite solution 30 used for the growth of the perovskite thin film may be an unsaturated solution, and may also be a saturated solution. When a saturated solution is used to grow the perovskite thin film, when the perovskite seed crystals 23 are soaked into the perovskite solution 30, the perovskite solution 30 is a saturated solution, and throughout the process of the growth of the perovskite thin film, the perovskite solution 30 is always in the saturation state. The perovskite solution 30 in the saturation state can enable the perovskite material to more easily precipitate from the perovskite solution 30, and, by the effect of the perovskite seed crystals 23, quickly precipitate at the surface of the perovskite seed crystals 23, to facilitate the perovskite seed crystals 23 to grow, to form the perovskite thin film with few defects and a high density.

When the perovskite solution 30 is a saturated solution, the impetus of the growth of the perovskite thin film comes from the degree of supersaturation of the solution. When the perovskite solution 30 is in the supersaturation state, the solute in the perovskite solution 30 tends to precipitate thermodynamically. In the presence of the perovskite seed crystals 23, the perovskite solute quickly precipitates at the surface of the perovskite seed crystals 23 by the effect of the perovskite seed crystals 23, to facilitate the perovskite seed crystals 23 to grow, thereby forming the perovskite thin film.

The preparation of the saturated perovskite solution 30 may include, while stirring, adding a certain amount of the perovskite solute into the solvent, subsequently stirring till the solute has been completely dissolved, subsequently adding the solute again, and circulating the process, till after stirring for 30 min the solute still cannot be dissolved, and then the preparation of the saturated perovskite solution 30 is completed.

It should be noted that, during the growth of the perovskite thin film, the perovskite solute might precipitate also at the side edges and the back face of the substrate 21. In this case, the side faces and the back face of the substrate 21 may be coated before growing the perovskite thin film, and the perovskite thin film may also be wiped by using a mixed solvent of acetonitrile and DMF or another polar solvent after the growing of the perovskite thin film to remove the solute.

Figure 9:
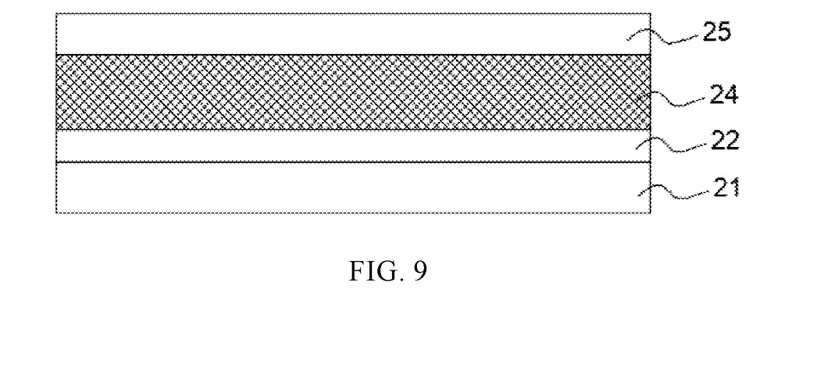

As shown in FIG. 9, a hole transporting layer 25 is formed on the perovskite layer 24. The material of the hole transporting layer 25 may be 2,2',7,7'-tetra[N,N-bis(4-methoxyphenyl)amino]-9,9'-spirodifluorene (Spiro-OMeTAD), poly[bis(4-phenyl)(2,4,6-trimethylphenyl)amine] (PTAA), 2,2',7,7'-tetra(di-p-tolylamino)spiro-9,9'-difluorene (Spiro-TTB) and so on. The process for forming the hole transporting layer 25 may be any one of spin coating, spray coating, magnetron sputtering and thermal evaporation, but is not limited thereto. It should be understood that, in the fabrication of the perovskite-layer solar cell, the electron transporting layer 22 is firstly fabricated, and the perovskite layer 24 and the hole transporting layer 25 are subsequently fabricated. In some perovskite layers, the hole transporting layer 25 may also be firstly fabricated, and the perovskite layer 24 and the electron transporting layer 22 are subsequently fabricated.

Figure 10:
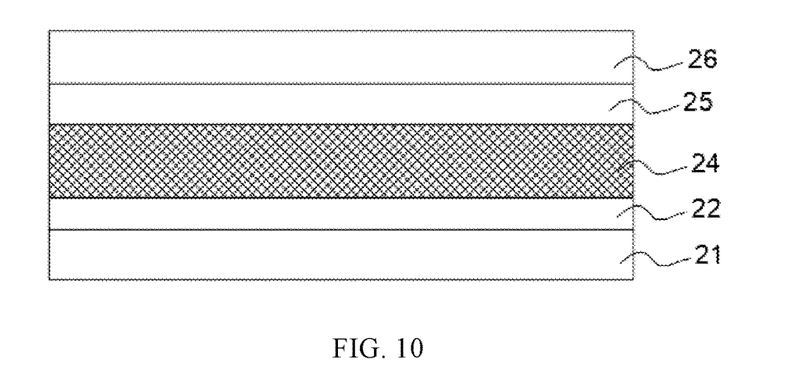

As shown in FIG. 10, a transparent electrically conducting layer 26 is formed on the hole transporting layer 25. The material of the transparent electrically conducting layer 26 may be one or more of tin-doped indium oxide (ITO), zinc-doped indium oxide (IZO), tungsten-doped indium oxide (IWO), titanium-doped indium oxide (ITIO), fluorine-doped tin oxide (FTO) and aluminum-doped zinc oxide (AZO). The process for forming the transparent electrically conducting layer 26 may be magnetron sputtering, hot vapor deposition and so on. It should be understood that, in some perovskite layers, the transparent electrically conducting layer 26 may be omitted.

Figure 11:
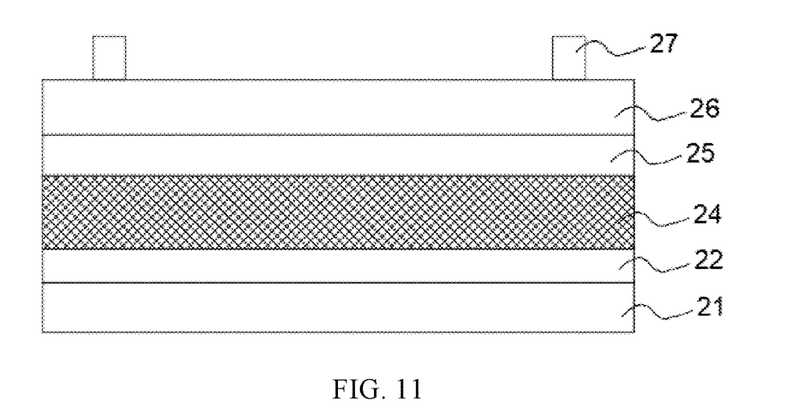

As shown in FIG. 11, electrodes 27 are fabricated on the transparent electrically conducting layer 26. Particularly, the material of the electrodes 27 may be a metal of a good electric conductivity such as silver and copper. The process for fabricating the electrodes 27 may be silk-screen printing, vapor deposition, sputtering and so on.

Based on the above-described preparing method, in the embodiments of the present application, the process of forming the perovskite seed crystals 23 and growing the perovskite seed crystals 23 into the perovskite thin film is performed in two steps. Firstly, the perovskite seed crystals 23 are formed on the substrate 21, and subsequently the perovskite seed crystals 23 are soaked into the perovskite solution 30. By the effect of the perovskite seed crystals 23, the perovskite seed crystals 23 grow into the perovskite thin film. Based on that, the process of forming the perovskite seed crystals 23 can be independently regulated, whereby the perovskite seed crystals 23 that have a high grain size and are distributed throughout the substrate 21 can be formed. By the effect of the perovskite seed crystals 23 that have a high grain size and are distributed throughout the substrate 21, the perovskite thin film covering the whole substrate 21 can grow, and the defects of the perovskite thin film can be reduced. In this case, such a perovskite thin film, after the annealing treatment, can form the perovskite layer 24 that covers the whole substrate 21 and has few defects, thereby increasing the conversion efficiency of the perovskite layer, and reducing the risk of electric leakage.

In order to verify the performance of the perovskite-layer solar cell fabricated by using the method for preparing a perovskite layer according to the embodiments of the present application, that will be described below by means of comparing multiple examples.

The First Embodiment

The method for preparing a perovskite layer according to the present embodiment is particularly as follows.

The first step: providing a clean FTO electrically conducting glass.

The second step: by spin coating, on the FTO electrically conducting glass, forming an electron transporting layer of the material of $SnO_2$ and the thickness of 100 nm.

The third step: dissolving 1032 mg of FAI and 461 mg of $PbI_2$ into 20 mL of DMF, and stirring at 60° C. for 2 h, to obtain a transparent perovskite-precursor solution, wherein $FAI:PbI_2$ (molar ratio)=6:1, and the solution concentration is 0.05 mol/L; spin-coating the perovskite-precursor solution onto the electron transporting layer, with a spin-coating speed of 3000 rpm and a spin-coating duration of 30 s; and, after the spin coating has ended, performing annealing treatment at 100° C. for 10 min-20 min, whereby after the solvent and the excessive FAI have been volatilized, $FAPbI_3$ seed crystals that are discretely distributed are formed on the electron transporting layer.

The fourth step: heating 50 mL of DMF in a beaker, keeping at 120° C., adding 0.6 g of $FAPbI_3$ perovskite till it is completely dissolved, and after the solution has become clear, adding again 0.6 g of $FAPbI_3$ perovskite to dissolve again; and repeating the dissolving process, till the perovskite cannot be dissolved further, to obtain a saturated DMF solution of the $FAPbI_3$ perovskite;

preheating the substrate having the perovskite seed crystals to 120° C., and subsequently soaking into the saturated DMF solution of the $FAPbI_3$ perovskite at 120° C.; sealing the beaker, and placing into a precise oven preheated to 120° C.; and setting a program, to cool the saturated perovskite solution to room temperature at a rate of 5° C./h. The growth thickness of the perovskite thin film is controlled by controlling the cooling amplitude of the saturated perovskite solution. In the process from 120° C. to room temperature, the amount of the perovskite solute precipitated due to the solubility difference is approximately equal to the amount of the perovskite deposited on the electron transporting layer. During the cooling, the solute in the saturated perovskite solution, by the driving by the degree of supersaturation, tends to be precipitated. By the effect of the perovskite seed crystals, crystallization happens at the surface of the perovskite seed crystals, and the perovskite seed crystals gradually grow, to form a layer of complete high-quality $FAPbI_3$ perovskite thin film.

The fifth step: by spin coating, on the perovskite layer, forming a hole transporting layer of the material of Spiro-OMeTAD and the thickness of 50 nm.

The sixth step: by hot vapor deposition, on the hole transporting layer, forming a transparent electrically conducting layer of the material of FTO and the thickness of 100 nm.

The seventh step: by vapor deposition, on the transparent electrically conducting layer, forming a silver electrode.

The Second Embodiment

The method for preparing a perovskite layer according to the present embodiment is substantially the same as the method for preparing a perovskite layer according to the first embodiment, differs merely in that:

The third step: adding 688 mg of FAI and 461 mg of $PbI_2$ into 20 mL of DMF, and stirring at 60° C. for 2 h, to obtain a transparent perovskite-precursor solution, wherein FAI:$PbI_2$ (molar ratio)=4:1, and the solution concentration is 0.05 mol/L; spin-coating the perovskite-precursor solution onto the electron transporting layer, with a spin-coating speed of 3000 rpm and a spin-coating duration of 30 s; and, after the spin coating has ended, performing annealing treatment at 105° C. for 10 min-20 min, whereby after the solvent and the excessive FAI have been volatilized, $FAPbI_3$ seed crystals are obtained on the electron transporting layer.

The fourth step: placing 50 mL of γ-butyrolactone into a beaker at room temperature (approximately 25° C.), adding 0.6 g of $FAPbI_3$ perovskite till it is completely dissolved, and after the solution has become clear, adding again 0.6 g of $FAPbI_3$ perovskite to dissolve again; and repeating the dissolving process, till the perovskite cannot be dissolved further, to obtain a saturated γ-butyrolactone solution of the $FAPbI_3$ perovskite. Because γ-butyrolactone has a higher boiling point, γ-butyrolactone as the solvent has a lower volatilization speed, and the thin film has a lower growth speed, whereby a perovskite thin film of a higher quality can be obtained;

soaking the substrate having the $FAPbI_3$ seed crystals into the saturated γ-butyrolactone solution of the $FAPbI_3$ perovskite, wherein the beaker is in an opening state; and placing the whole system (the beaker) into an environment where the temperature is precisely controlled, heating from room temperature to 60° C. at a heating rate of 10° C./h, and maintaining the temperature for 6 h-12 h. In that process, the solvent in the saturated solution continuously volatilizes, the perovskite seed crystals gradually grow, and finally a layer of high-quality $FAPbI_3$ perovskite thin film is obtained.

The Third Embodiment

The method for preparing a perovskite layer according to the present embodiment is substantially the same as the method for preparing a perovskite layer according to the first embodiment, differs merely in that:

The third step: adding 259.8 mg of CsI and 461 mg of $PbI_2$ into 50 mL of DMF, and stirring at 80° C. for 2 h, to obtain a transparent and clear perovskite-precursor solution, wherein CsI:$PbI_2$ (molar ratio)=1.05:1, and the perovskite concentration is 0.02 mol/L; spin-coating the perovskite-precursor solution onto the electron transporting layer, with a spin-coating speed of 4000 rpm and a spin-coating duration of 45s; and, after the spin coating has ended, performing annealing treatment at 160° C. for 10 min-30 min, whereby $CsPbI_3$ seed crystals are obtained on the electron transporting layer;

heating 50 mL of DMSO in a beaker to 130° C., maintaining the temperature, adding 0.6 g of $CsPbI_3$ perovskite till it is completely dissolved, and after the solution has become clear, adding again 0.6 g of $CsPbI_3$ perovskite to dissolve again; and repeating the dissolving process, till the perovskite cannot be dissolved further, to obtain a saturated DMSO solution of the $CsPbI_3$ perovskite;

preheating the substrate having the $CsPbI_3$ seed crystals to 130° C., and subsequently soaking into the saturated DMSO solution of the $CsPbI_3$ perovskite maintained at 130° C.; sealing the beaker, and placing it into a precise oven preheated to 130° C.; and setting a program, to cool the whole system to room temperature at a rate of 6° C./h. During the cooling, the solute in the saturated solution, by the driving by the supersaturation, tends to be precipitated. By the effect of the seed crystals, crystallization happens slowly at the surface of the perovskite seed crystals, and the perovskite seed crystals gradually grow, to form a layer of complete high-quality $CsPbI_3$ perovskite thin film.

The Fourth Embodiment

The method for preparing a perovskite layer according to the present embodiment is substantially the same as the method for preparing a perovskite layer according to the first embodiment, differs merely in that:

The third step: adding 259.8 mg of CsI and 461 mg of $PbI_2$ into 50 mL of DMF, and stirring at 80° C. for 2 h, to obtain a transparent and clear perovskite-precursor solution, wherein CsI:$PbI_2$ (molar ratio)=1:1, and the perovskite concentration is 0.02 mol/L; spin-coating the perovskite-precursor solution onto the electron transporting layer, with a spin-coating speed of 4000 rpm and a spin-coating duration of 45s; and, after the spin coating has ended, performing annealing treatment at 160° C. for 10 min-30 min, whereby $CsPbI_3$ seed crystals are obtained on the electron transporting layer;

placing 50 mL of γ-butyrolactone into a beaker at room temperature, adding 0.6 g of $CsPbI_3$ perovskite till it is completely dissolved, and after the solution has become clear, adding again 0.6 g of $CsPbI_3$ perovskite to dissolve again; and repeating the dissolving process, till the perovskite cannot be dissolved further, to obtain a saturated γ-butyrolactone solution of the $CsPbI_3$ perovskite;

soaking the substrate having the $CsPbI_3$ seed crystals into the saturated γ-butyrolactone solution of the $CsPbI_3$ perovskite, wherein the beaker is in an opening state; and placing the whole system into an environment where the temperature is precisely controlled, heating from room temperature to 70° C. at a heating rate of 10° C./h, and maintaining the temperature for 8 h-16 h. The solvent in the saturated perovskite solution continuously volatilizes, the perovskite seed crystals gradually grow, and finally a layer of $CsPbI_3$ perovskite thin film is obtained.

The Fifth Embodiment

The method for preparing a perovskite layer according to the present embodiment is substantially the same as the method for preparing a perovskite layer according to the first embodiment, differs merely in that:

The fourth step: heating 50 mL of DMF in a beaker, keeping at 120° C., and adding 3 g of $FAPbI_3$ perovskite till it is completely dissolved, whereby after the solution has become clear, a unsaturated DMF solution of the $FAPbI_3$ perovskite is obtained.

By observing the microstructures of the perovskite layers prepared in the first embodiment to the fifth embodiment, it is found that the perovskite layers prepared in the first embodiment to the fifth embodiment have few cracks, grain boundaries and voids, and have a high compactness.

Although the present application has been described herein with reference to the embodiments, in the process of the implementation of the claimed subject matters of the present application, a person skilled in the art can comprehend and implement other variations of the embodiments of the present disclosure by reading the drawings, the disclosure and the appended claims.

Figure 12:
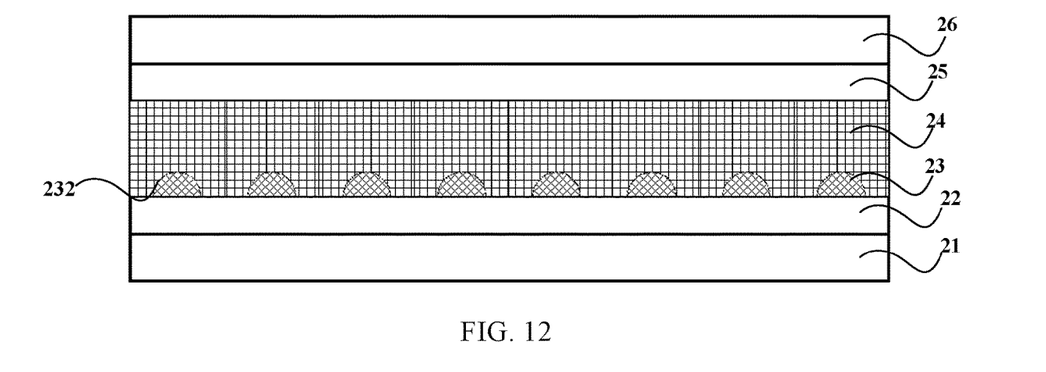
FIG. 12 is a schematic structural diagram of a perovskite layer according to an embodiment of the present application.

As shown in FIG. 12, in the second aspect, the present application further provides a perovskite layer. The perovskite layer may be prepared by using the method for preparing a perovskite layer according to any one of the above-described embodiments. The perovskite layer includes perovskite seed crystals and a perovskite thin film. A first interface is disposed between the perovskite seed crystals and the perovskite thin film, wherein the first interface is an interface that is observable by using a high-resolution scanning electron microscope. The first interface that can be observed by using a high-resolution scanning electron microscope is formed between the perovskite seed crystals and the perovskite thin film.

Figure 13:
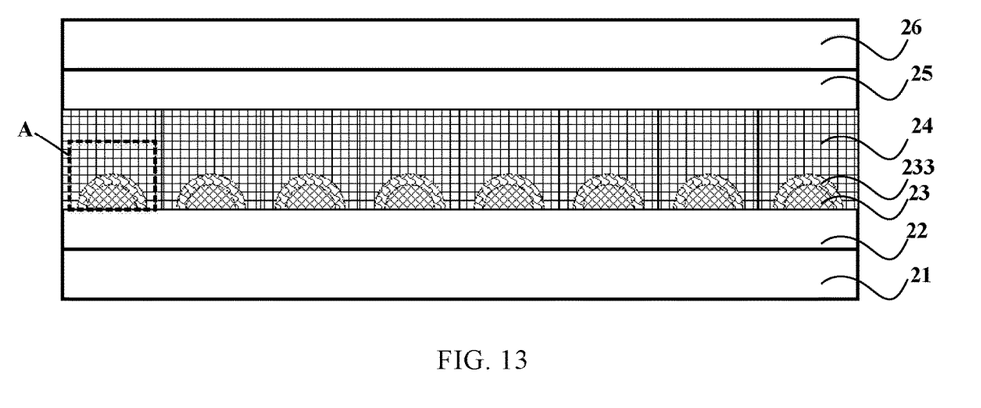
FIG. 13 is a schematic structural diagram of another perovskite layer according to an embodiment of the present application.
Figure 14:
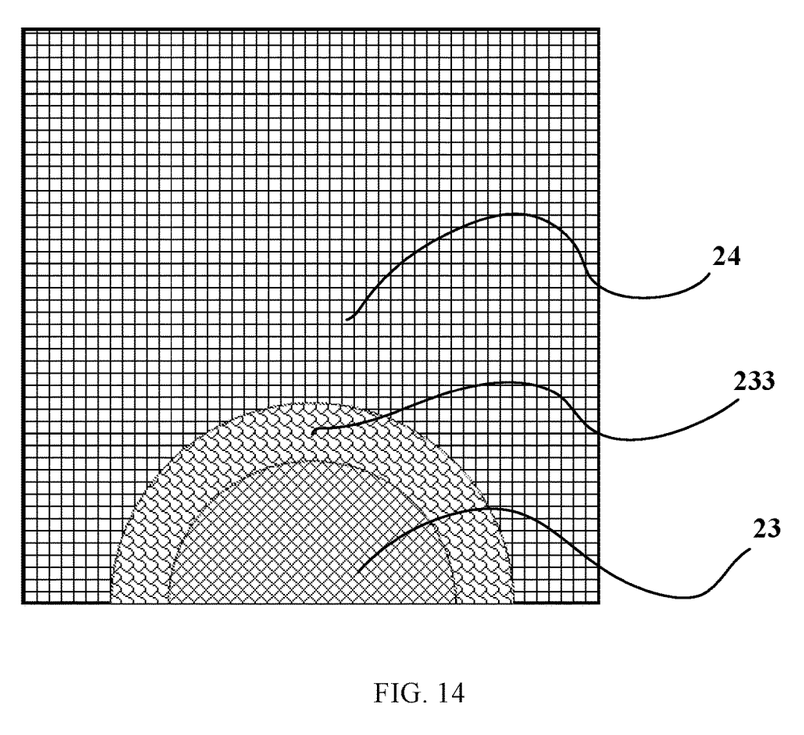
FIG. 14 is a partially enlarged schematic diagram at the position A in FIG. 13 according to an embodiment of the present application.

As shown in FIGS. 13 and 14, in some possible implementations, the first interface between the perovskite seed crystals and the perovskite thin film is a structure transition layer, wherein the lattice parameter of the structure transition layer changes in a first order, and the atom-arrangement mode of the structure transition layer changes in a second order, wherein the first order refers to an order in which, in the direction further away from the perovskite seed crystals, an initial parameter changes into a second parameter greater than the initial parameter and subsequently changes into the initial parameter, and the second order refers to an order in which, in the direction further away from the perovskite seed crystals, an ordered arrangement changes into an unordered arrangement and subsequently changes into an ordered arrangement. Because the lattice parameter of the structure transition layer changes in the first order, and the atom-arrangement mode of the structure transition layer changes in the second order, the defect concentration also changes in the order in which, in the direction further away from the perovskite seed crystals, an initial concentration changes into a second concentration greater than the initial concentration and subsequently changes into the initial concentration, and therefore the variation of the perovskite seed crystals is slower in the process of the formation of the perovskite thin film, whereby the formed first interface has fewer defects, to prevent sudden change of the perovskite thin film due to a direct changing.

In some possible implementations, the thickness of the structure transition layer is greater than the thickness of atom layers of a certain numerical value, which is generally the thickness of 10 atom layers. The thickness of the structure transition layer 233 is greater than or equal to 0.5 nm, and less than or equal to 5 nm. Accordingly, the perovskite seed crystals 23 and the perovskite thin film 24 have the effect of "slow transition".

It should be noted that, in the present application, wordings such as "exemplary" or "for example" are intended to indicate examples, illustrations or descriptions. Any embodiment or solution in the present application that is described as "exemplary" or "for example" should not be interpreted as more preferable or more preferential than other embodiments or solutions. More exactly, wordings such as "exemplary" or "for example" are intended to present the relevant concepts in a particular manner.

In the present application, "at least one" refers to "one or more", and "plurality of" refers to "two or more". "And/or" describes the association relation of the linked objects, and indicates the existence of three relations. For example, "A and/or B" may indicate the sole existence of A, the sole existence of B and the existence of both of A and B, wherein A and B may be singular or plural. The character "/" generally indicates that the linked objects are of the relation of "or". "At least one of the following items", or its similar expressions, refers to any combination of those items, including a single item or any combination of a plurality of items. For example, "at least one of a, b and c" may represent a, b, c, the combination of a and b, the combination of a and c, the combination of b and c, or the combination of a, b and c, wherein a, b and c may be single, and may also be plurality.

Although the present application has been described with reference to the particular features and the embodiments thereof, apparently, they may have various modifications and combinations without departing from the spirit and scope of the present application. Correspondingly, the description and the drawings are merely illustrative description on the present application defined by the appended claims, and are deemed as having already covered any and all of modifications, variations, combinations and equivalents within the scope of the present application. Apparently, a person skilled in the art may make various modifications and variations on the present application without departing from the spirit and the scope of the present application. Accordingly, if those modifications and variations on the present application fall within the scope of the claims of the present application and equivalents thereof, then the present application is also intended to encompass those modifications and variations.

The invention claimed is:

1. A method for preparing a perovskite layer, comprising:
providing a substrate;
forming perovskite seed crystals on the substrate;
soaking the perovskite seed crystals into a perovskite solution to grow into a perovskite thin film; and
performing annealing treatment to the perovskite thin film, to form the perovskite layer;
wherein during the growing of the perovskite seed crystals into the perovskite thin film, a solubility of a perovskite material in the perovskite solution is reduced to facilitate the perovskite material to precipitate from the perovskite solution and supply the perovskite material for the growing of the perovskite seed crystals; or
during the growing of the perovskite seed crystals into the perovskite thin film, volatilization of a solvent is accelerated by heating to facilitate the perovskite material to precipitate from the perovskite solution and supply the perovskite material for the growing of the perovskite seed crystals.

2. The method for preparing a perovskite layer according to claim 1, wherein the solubility of the perovskite material is reduced by cooling.

3. The method for preparing a perovskite layer according to claim 2, wherein a cooling speed of the cooling is 0.1° C./h-10° C./h; and/or
before the cooling, an initial temperature of the perovskite solution is 100° C.-150° C.

4. The method for preparing a perovskite layer according to claim 1, wherein
an initial temperature of the perovskite solution is 20° C.-30° C.; and
during the growing of the perovskite seed crystals into the perovskite thin film, the heating temperature is 40° C.-100° C.

5. The method for preparing a perovskite layer according to claim 1, wherein when the perovskite seed crystals are soaked into the perovskite solution, the perovskite solution is a saturated solution.

6. The method for preparing a perovskite layer according to claim 1, wherein the step of forming the perovskite seed crystals on the substrate comprises:
coating a perovskite-precursor solution onto the substrate, and volatilizing a solvent of the perovskite-precursor solution, to form perovskite-seed-crystal intermediates; and
performing annealing treatment to the perovskite-seed-crystal intermediates, to form the perovskite seed crystals.

7. The method for preparing a perovskite layer according to claim 6, wherein a general formula of the perovskite seed crystals is $ABX_3$;
the perovskite-precursor solution comprises an AX precursor and a $BX_2$ precursor, wherein X is a halogen element; and
the perovskite seed crystals are an organic-inorganic hybrid material, and a ratio of an amount of substance of the AX precursor to an amount of substance of the $BX_2$ precursor is (2-15):1, or the perovskite seed crystals are a fully inorganic material, and the ratio of the amount of substance of the AX precursor to the amount of substance of the $BX_2$ precursor is (0.95-1.05):1.

8. The method for preparing a perovskite layer according to claim 7, wherein a concentration of the perovskite-precursor solution is less than or equal to 0.1 mol/L; and/or
a duration of the annealing treatment for forming the perovskite seed crystals is 1 min-30 min.

9. The method for preparing a perovskite layer according to claim 8, wherein the perovskite seed crystals are an organic-inorganic hybrid material, a temperature of the annealing treatment for forming the perovskite seed crystals is 60° C.-130° C.; or
the perovskite seed crystals are a fully inorganic material, and a temperature of the annealing treatment for forming the perovskite seed crystals is 120° C.-220° C.

10. The method for preparing a perovskite layer according to claim 1, wherein a perovskite component of the perovskite seed crystals and a perovskite component of the perovskite solution are the same.

11. A method for preparing a perovskite layer, comprising:
providing a substrate;
forming perovskite seed crystals on the substrate;
soaking the perovskite seed crystals into a perovskite solution to grow into a perovskite thin film; and
performing annealing treatment to the perovskite thin film, to form the perovskite layer;
wherein the perovskite seed crystals are distributed on the substrate in a discrete distribution.

12. The method for preparing a perovskite layer according to claim 11, wherein a coverage rate of the perovskite seed crystals on the substrate is 10%-50%, and a particle size of the perovskite seed crystals is 10 nm-200 nm.

13. A perovskite layer, wherein the perovskite layer comprises perovskite seed crystals and a perovskite thin film; and
a first interface is disposed between the perovskite seed crystals and the perovskite thin film, and the first interface is observable by using a high-resolution scanning electron microscope;
wherein the first interface between the perovskite seed crystals and the perovskite thin film further comprises a structure transition layer, wherein a lattice parameter of the structure transition layer changes in a first order, and an atom-arrangement mode of the structure transition layer changes in a second order, wherein the first order refers to an order in which, in a direction further away from the perovskite seed crystals, an initial parameter changes into a second parameter greater than the initial parameter and subsequently changes into the initial parameter, and the second order refers to an order in which, in the direction further away from the perovskite seed crystals, an ordered arrangement changes into an unordered arrangement and subsequently changes into an ordered arrangement.

14. The perovskite layer according to claim 13, wherein a thickness of the structure transition layer is greater than or equal to 0.5 nm, and less than or equal to 5 nm.

15. A perovskite solar cell, wherein the perovskite solar cell comprises the perovskite layer according to claim 13.

16. A perovskite-layer-solar-cell assembly, wherein the perovskite-layer-solar-cell assembly comprises the perovskite solar cell according to claim 15.

17. The perovskite solar cell according to claim 15, wherein the first interface between the perovskite seed crystals and the perovskite thin film further comprises a structure transition layer, wherein a lattice parameter of the structure transition layer changes in a first order, and an atom-arrangement mode of the structure transition layer changes in a second order, wherein the first order refers to an order in which, in a direction further away from the perovskite seed crystals, an initial parameter changes into a second parameter greater than the initial parameter and subsequently changes into the initial parameter, and the second order refers to an order in which, in the direction further away from the perovskite seed crystals, an ordered arrangement changes into an unordered arrangement and subsequently changes into an ordered arrangement.

* * * * *